(12) United States Patent
Stevenson et al.

(10) Patent No.: US 7,859,317 B1
(45) Date of Patent: Dec. 28, 2010

(54) LOW POWER HIGH SLEW NON-LINEAR AMPLIFIER FOR USE IN CLOCK GENERATION CIRCUITRY FOR NOISY ENVIRONMENTS

(75) Inventors: Paul E. Stevenson, Colorado Springs, CO (US); Nathan Enger, Colorado Springs, CO (US); Jon E. Tourville, Colorado Springs, CO (US)

(73) Assignee: Marvell International Ltd., Hamilton (BM)

( * ) Notice: Subject to any disclaimer, the term of this patent is extended or adjusted under 35 U.S.C. 154(b) by 275 days.

(21) Appl. No.: 12/104,386

(22) Filed: Apr. 16, 2008

Related U.S. Application Data

(60) Provisional application No. 60/912,347, filed on Apr. 17, 2007.

(51) Int. Cl.
*H03K 5/12* (2006.01)

(52) U.S. Cl. .................... 327/170; 327/184; 327/291

(58) Field of Classification Search .............. 327/170, 327/184, 291, 292
See application file for complete search history.

(56) References Cited

U.S. PATENT DOCUMENTS

| | | | | |
|---|---|---|---|---|
| 4,216,393 A | * | 8/1980 | Gillberg et al. ........... 326/88 |
| 4,386,284 A | * | 5/1983 | Wacyk et al. ........... 327/170 |
| 4,812,687 A | * | 3/1989 | Larson et al. ........... 327/263 |
| 5,177,374 A | * | 1/1993 | Carpenter et al. ........ 327/109 |
| 5,469,100 A | * | 11/1995 | Wuidart et al. ........... 327/262 |
| 6,281,730 B1 | * | 8/2001 | Vu ........................ 327/170 |
| 6,861,917 B2 | | 3/2005 | Stevenson et al. ......... 331/183 |

* cited by examiner

*Primary Examiner*—Lincoln Donovan
*Assistant Examiner*—William Hernandez

(57) ABSTRACT

Clock generation circuitry is arranged in stages so as to convert a slow slew rate input signal into a high slew rate clock signal in a low power environment. Each stage includes a capacitor and an inverter, both fed by respective current mirrors. The capacitor is trickle-charged through its current mirror, and charge of the capacitor is dumped onto an output of the stage at a controlled timing. Two or more such stages may be provided, so as to improve the slew rate of both of the leading and trailing edges of the clock signal, and also so as to provide a convenient source of timing for dumping charge of each capacitor. Each stage might also include a diode switchably connected across the capacitor, so as to discharge the capacitor at appropriate timings, to reduce interference on succeeding stages that might otherwise be caused by residual charge on the capacitor.

14 Claims, 11 Drawing Sheets

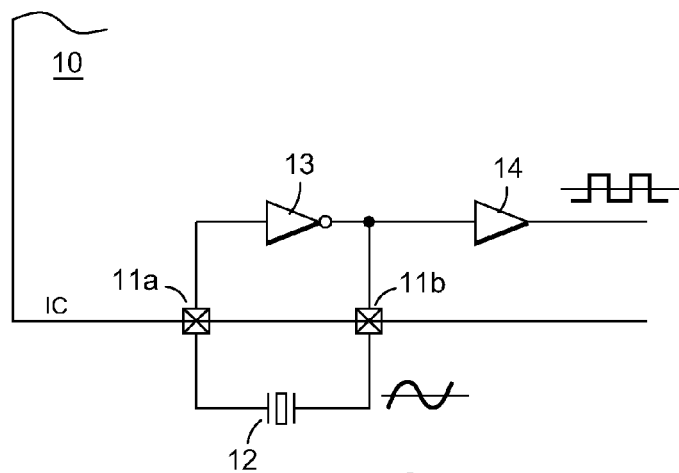
FIG. 1
(Prior Art)
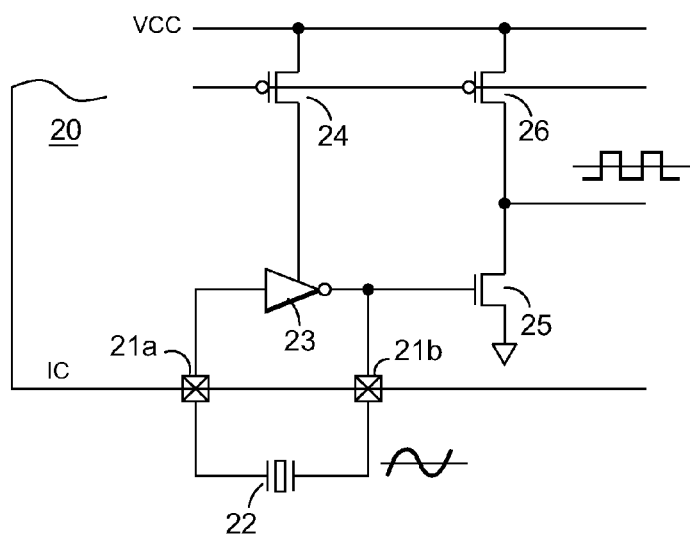 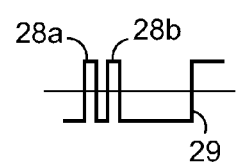
FIG. 2
(Prior Art)
FIG. 2A

LOW POWER HIGH SLEW NON-LINEAR AMPLIFIER FOR USE IN CLOCK GENERATION CIRCUITRY FOR NOISY ENVIRONMENTS

CROSS-REFERENCE TO RELATED APPLICATION

This application claims the benefit of U.S. Provisional Patent Application No. 60/912,347, filed Apr. 17, 2007, the contents of which are hereby incorporated by reference as if fully stated herein.

FIELD

The present disclosure relates to generation of a clock signal, and more particularly to the generation of a clock signal having a high slew rate using an input signal having a relatively low slew rate.

BACKGROUND

In communication and application processes, there is often a need for time-keeping circuitry that is active while most other processes are in a "sleep" mode. For conservation of battery life and other factors, it is desirable that such time-keeping circuitry use only small amounts of power. As one example, a microprocessor in a mobile telephone or personal digital assistant often requires a very low power precision clock signal during sleep mode, so that the microprocessor can be awakened to process an incoming telephone call or other data.

One simple implementation of circuitry for generation of a low power clock signal is shown in FIG. 1. FIG. 1 shows an integrated circuit 10 which contains auxiliary circuitry (not shown) such as the above-mentioned microprocessor, together with a pair of input terminals 11a and 11b. A crystal oscillator 12 is connected across the input terminals, and generates a sinusoidal wave at a frequency (for example) of 32 kHz. Clock signal generation circuitry includes an inverter 13 and an amplifier 14. Inverter 13 inverts the sinusoidal input, and the amplifier 14 is driven at high gain so as to convert the sinusoidal wave into a rail-to-rail square wave at the same frequency as that of crystal oscillator 12, i.e. at 32 kHz.

Although such circuitry desirably generates a clock signal with high slew rate, the circuit is not a low power circuit. Specifically, because the input sinusoidal wave is a slow-slewing signal, the circuitry shown in FIG. 1 will exhibit high crowbar current. As one example, assume that inverter 13 is implemented as a PMOS or NMOS transistor, or as a PMOS/NMOS pair of transistors. For such configurations, there will be a period of time during zero-crossing of the sinusoidal input signal where all transistors are "ON" and conducting full current (crowbar current) directly from source to ground. As a result, and since the circuitry of FIG. 1 is not a low power circuit, it is not suitable for use in many environments, particularly those where power management is important.

A common technique for reducing the power consumption of the circuitry shown in FIG. 1 is to run all initial stages of amplification from current minors. A simplified example of such an arrangement is shown in FIG. 2. FIG. 2 shows an integrated circuit 20 which, like FIG. 1, contains auxiliary circuitry (not shown) such as the above-mentioned microprocessor, together with a pair of input terminals 21a and 21b. Crystal oscillator 22 is connected across input terminals 21a and 21b. Inverter 23 is fed from a first current mirror 24, which budgets the amount of current that can be used by the inverter 23. The output of inverter 23 is provided to amplifier 25, which is fed by second current mirror 26 and which is driven at a high gain so as to convert the sinusoidal wave into a rail-to-rail square wave at the same frequency as that of crystal oscillator 22.

SUMMARY

One problem with the circuitry of FIG. 2 is illustrated in the magnified view of FIG. 2A. FIG. 2A shows a timewise-magnified view of the clock signal outputted to the auxiliary circuitry. Generally speaking, all such circuitry operates in an electrically noisy environment. Because of the noise of the environment, it is possible for the clock generation circuitry of FIG. 2 to generate spurious clock signals, such as those depicted at 28a and 28b. In more detail, the desired clock signal should typically include only a single leading edge at each clock interval, such as the desired output depicted at 29. However, because of the electrical noise of the environment, it is possible to generate spurious signals such as 28a and 28b.

The foregoing situation is addressed through the provision of clock generation circuitry with a capacitor which is trickle-charged using a controlled amount of current, and whose charge is dumped onto an output of the circuitry at a controlled timing so as to increase the slew rate of the clock signal. The capacitor is often included as part of a multi-stage clock generation circuit, wherein each stage includes the capacitor and an inverter, both fed by respective current mirrors. Example embodiments of the invention have two or more such stages, so as to improve the slew rate of both the leading edge and the trailing edge of the clock signal, and also so as to provide a convenient source of the timing at which the charge of each capacitor is dumped onto the output of each stage.

The invention is novel in that it uses a carefully controlled current source of very small magnitude to trickle charge a capacitor, which is then dumped onto a node to provide fast slew.

Each stage might also include a diode switchably connected across the capacitor, so as to discharge residual charge on the capacitor at appropriate timings, thereby to reduce the possibility that residual charge on the capacitor might interfere with succeeding stages.

In one example embodiment, a clock generation circuit is provided which generates a high slew rate clock signal using a slow slew rate input signal. The clock generation circuit comprises an inverter fed by a first current mirror, for inverting the input signal; and a capacitor charged through a second current mirror, wherein the capacitor is coupled by a first switch across an output of the inverter. The first switch is actuated at a timing which substantially corresponds to a leading edge of the output of the inverter, so as to dump charge of the capacitor onto the output of the inverter, thereby to pull the output of the inverter at an increased slew rate. The first switch is thereafter opened, so as to allow the second current mirror to charge the capacitor in preparation for a subsequent actuation of the first switch.

Other embodiments may further include a diode connected by a second switch across the capacitor, wherein the second switch is actuated after actuation of the first switch so as to drain the capacitor through the diode, and wherein the second switch is thereafter opened, so as to allow the second current mirror to charge the capacitor in preparation for a subsequent actuation of the first switch.

In other embodiments, a clock generation circuit according may include multiple stages including first and second stages.

The first stage is comprised of the afore-mentioned inverter, capacitor, first switch, and first and second current mirrors. The second stage comprises a second inverter fed by a third current mirror, for inverting the output of the first inverter; and a second capacitor charged through a fourth current mirror. The second capacitor is coupled by a third switch across an output of the second inverter. The third switch is actuated at a timing which substantially corresponds to a leading edge of the output of the second inverter, so as to dump charge of the second capacitor onto the output of the second inverter, thereby to pull the output of the second inverter at an increased slew rate. The third switch is thereafter opened, so as to allow the third current mirror to charge the second capacitor in preparation for a subsequent actuation of the third switch.

Other embodiments may include a diode or diodes, so as to discharge the capacitor. For example, in embodiments where there are two stages, each with a switchable capacitor, the embodiment may further comprise a first diode connected by a second switch across the capacitor, wherein the second switch is actuated after actuation of the first switch so as to drain the capacitor through the diode, and wherein the second switch is thereafter opened, so as to allow the second current mirror to charge the capacitor in preparation for a subsequent actuation of the first switch. In addition, a second diode is provided, connected by a fourth switch across the second capacitor, wherein the fourth switch is actuated after actuation of the third switch so as to drain the second capacitor through the second diode, and wherein the fourth switch is thereafter opened, so as to allow the fourth current mirror to charge the second capacitor in preparation for a subsequent actuation of the third switch.

A clock generation circuit may be packaged in an integrated circuit, wherein the integrated circuit includes terminals coupled to the inverter and across which a crystal oscillator is connectable, for providing the input signal to the inverter. The integrated circuit may include auxiliary circuitry operable in at least a sleep mode and an operational mode. In such cases, the high slew rate clock signal clocks the auxiliary circuitry during the sleep mode.

Methods of use and operation of such clock generation circuitry are also included within the scope of invention.

A more complete understanding of this disclosure can be obtained by reference to the following detailed description and to the attached drawings.

BRIEF DESCRIPTION OF THE DRAWINGS

FIGS. 1 and 2 are simplified schematic views for explaining clock generation circuits according to the prior art.

FIG. 2A is a magnified view of a waveform illustrating spurious clock signals.

DETAILED DESCRIPTION

Figure 3:
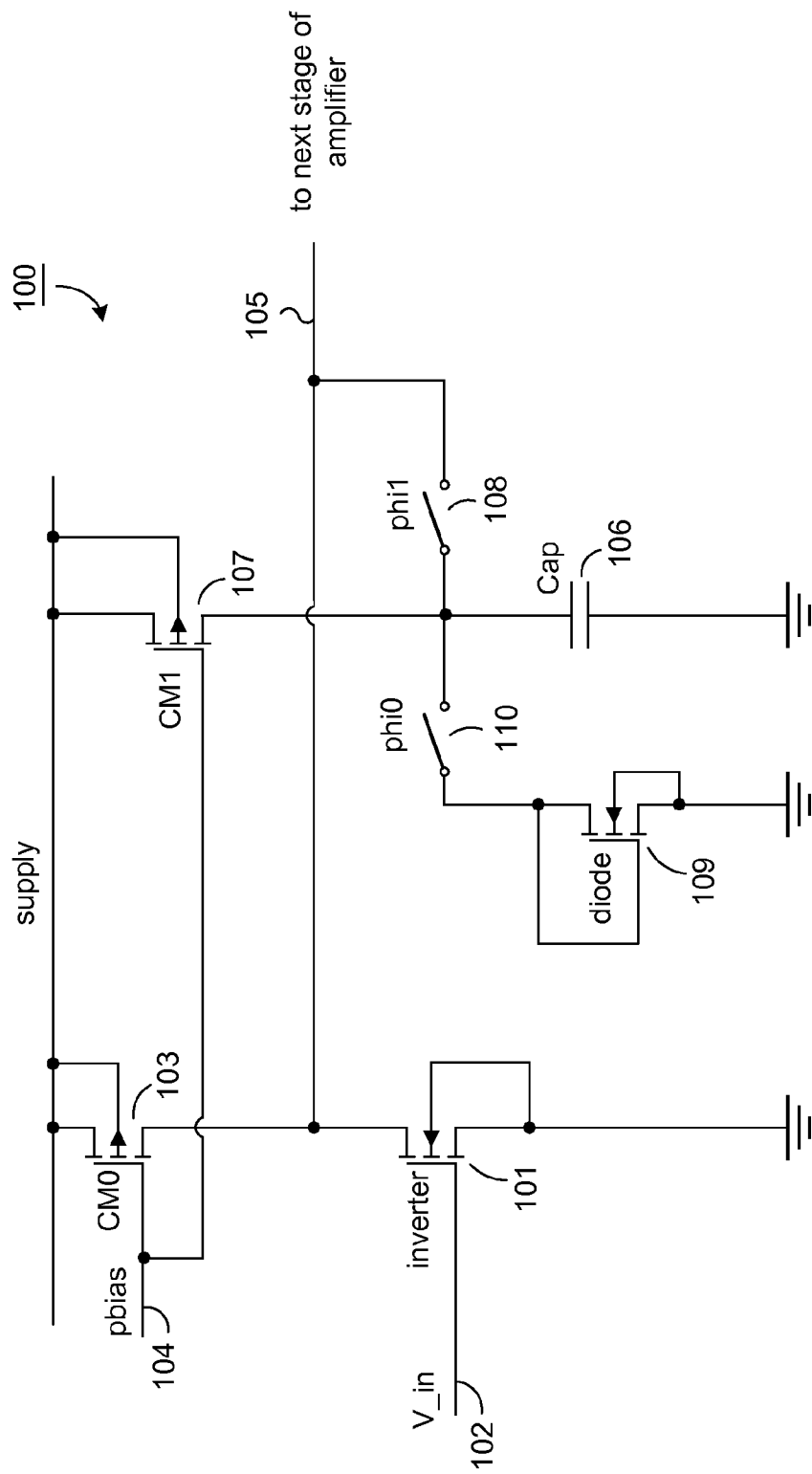
FIG. 3 is a schematic view of a clock generation circuit according to a first example embodiment of the invention.

To summarize difficulties with prior art configurations, as discovered by the inventors herein, circuits which use inverters supplied by current mirrors, hence current limited inverters, suffer from slow slew rates for the sake of power conservation and the ability to budget power. Slow slew rates introduce spurious clock signals such as through noise-induced glitches. As one particular example, a clock generation circuit driven by a 32 kHz crystal oscillator has proven to be susceptible to supply noise at the stages which convert the slow slewing crystal oscillation waveform into a fast slewing CMOS level clock. This susceptibility is often manifested by extra clock pulses or glitches in the clock. The glitches affect system timing as they effectively increase the clock frequency. This undesired performance has been observed both in architectures that share a differential comparator architecture, and those that use a single input inverter. More generally, clock generation circuits which slew slowly are prone to noise induced glitches.

Slow slew clocks are due to attempts to limit the power consumed by the oscillator circuits. Because the input waveform from a crystal oscillator is nearly sinusoidal, using the input waveform to drive a standard CMOS inverter without current-limiting will result in unacceptable crowbar current. Schmitt triggers also have unacceptable crowbar current as can be shown readily through either simulation or hand analysis.

Example embodiments of the invention herein typically prevent unacceptable crowbar current through the use of current minors to control the first few stages of amplification, thus precisely controlling the amount of current used. However, the current mirrors also limit the pull-down and/or pull-up slew rates depending on which type of mirror is used, NMOS or PMOS, respectively. Thus, example embodiments of the invention typically convert a slow slew signal, which is typical for low power, low frequency, crystal oscillators, into a high slew signal while simultaneously controlling the crowbar current using multiple stages, until a stage is reached where the slew rate is sufficiently fast that crow bar current has been minimized. The circuit allows budgeting of current consumption while still achieving a high slew rate for good noise immunity.

As such, example embodiments of the invention provide clock generation circuitry that maintains low power and the ability to budget power, while achieving high slew rates. Hence this circuitry is robust to noise, yet maintains the ability to precisely define the power consumption, so as to meet a budgeted power allocation and achieve low power consumption.

Very low power clock generation circuits offer competitive advantages in many fields, such as for mobile devices, because they increase the stand-by time for a given battery. Given the amount of switching noise present in many environments, such as system-on-chip (SOC) environments, it is preferable for the clock generation circuitry also to be robust against noise. Increased slew rate is a traditional method of providing noise robustness. It can be shown that the noise frequency an inverter is susceptible to is proportional to 1/slew. Thus, high slew means high robustness against noise.

Use of the circuitry described herein often provides additional benefits, such as by allowing a chip designer to budget current accurately through the use of current minors, and achieve high slew rate.

Example embodiments of the invention are often used to convert a low amplitude sinusoid at, for example, 32 kHz, into a rail-to-rail 32 kHz square wave. However, the invention can be implemented by extension to other applications where the design is concerned with controlling crowbar current while amplifying a signal at a high slew rate on a limited power budget.

Typical example embodiments of the invention will include an inverter made from an NMOS transistor with a PMOS current mirror feeding the NMOS transistor, a capacitor to store charge supplied from another PMOS current mirror, and switches and diodes to control the dumping of charge from the capacitor onto the output of the inverter in proper synchronization with the signal to be amplified.

FIRST EMBODIMENT

FIG. 3 shows a simplified schematic of a first example embodiment of the invention. In FIG. 3, clock generation circuit 100 is packaged in an integrated circuit together with auxiliary circuitry (not shown). The auxiliary circuitry is clocked by a clock signal from clock generation circuitry 100. The integrated circuit ordinarily includes terminals across which a crystal oscillator is connectable, for providing the input signal to clock generation circuitry 100. Typically, the auxiliary circuitry is operable in at least a sleep mode and an operational mode, and clock generation circuitry 100 clocks the auxiliary circuitry during the sleep mode.

As shown in FIG. 3, an inverter 101 receives an input signal (V_in) 102. In this example embodiment, the V_in input signal 102 is a slow slew rate input signal such as the sinusoidal output of a crystal oscillator. Inverter 101 is fed by current mirror 103, which is controlled by bias voltage 104 so as to budget the amount of current/power consumed by inverter 101. The V_in input signal 102 is inverted by inverter 101 and is output as signal 105. Signal 105 is provided to a next stage of amplification, if such a stage is needed in view of the slew rate obtained by circuitry 100 relative to target goals for slew rate. Otherwise, the output signal 105 is provided as the clock signal to the auxiliary circuitry.

Output 105 of inverter 101 is boosted by charge stored on capacitor 106. In this example embodiment, charge stored on capacitor 106 is dumped onto output 105 so as to increase the slew rate of the output signal 105. In more detail, a second current mirror 107 supplies a trickle-charge of current to capacitor 106. In this embodiment, current mirror 107 is biased by the same bias 104 as that used to bias first current mirror 103. Under control of switch 108, the accumulated charge on capacitor 106 is dumped onto output 105. Timing for actuation of switch 108 is accomplished by signal phi1, which operates to close switch 108 at a timing which generally corresponds to the leading edge of output signal 105. Switch 108 may be closed only briefly, relative to the cycle time (period) of the clock signal, since it is at the leading edge that the slew rate is increased through the dumping accumulated charge from capacitor 106. Thereafter, switch 108 is opened, so as to permit a next cycle of trickle-charging for capacitor 106 through second current mirror 107.

In this example embodiment, a diode 109 is provided so as to ensure that capacitor 106 is fully discharged. This helps to reduce the possibility that residual charge on the capacitor might otherwise interfere with proper operation of succeeding stages. In this example embodiment, diode 109 is implemented as an NMOS transistor. Second switch 110 operates at a timing determined by signal phi0, which actuates switch 110 to a closed position (thereby discharging capacitor 106) at a timing after actuation of the first switch 108. Thereafter, second switch 110 is opened, so as to re-introduce capacitor 106 into the circuit, and thereby allow capacitor 106 to accumulate charge through second current mirror 107.

In this example embodiment, inverter 101 is implemented as an NMOS transistor, and current mirrors 103 and 107 are implemented as PMOS transistors. A similar circuit could be constructed using NMOS current mirrors and a PMOS inverter.

Operation of clock generation circuitry 100 will now be described. The V_in input signal 102 goes low, shutting inverter 101 off. Output signal 105 starts to rise at the limited rate determined by leakage, parasitic capacitance, and the strength of first current mirror 103. Once output signal 105 reaches a pre-determined voltage (for which further information is provided below), first switch 108 closes under control of timing signal phi1, causing accumulated charge on capacitor 106 to be dumped onto output 105, thereby to rapidly pull output 105 to a high level. When the next stage of amplification has completed switching, phi1 causes switch 108 to open, and phi0 causes switch 110 to close. Diode 109 causes charge to drain off of capacitor 106 so the capacitor is disarmed. Meanwhile, the V_in input signal 102 continues to change, and eventually goes high. This pulls the output 105 of inverter 101 to a low level. Switch 110 is opened via phi0, and switch 108 remains open. Hence, capacitor 106 is recharged through current mirror 107, in preparation for a next trigger event (during a next cycle of operation).

The pre-determined voltage at which first switch 108 closes under control of timing signal phi1 will now be described. This pre-determined voltage is related to the switching voltage of the next stage of amplification. When the next stage is just beginning to switch from high to low, due to output 105 going from low to high, phi1 must shut to rapidly pull output 105 above the switch point of the next stage. This timing for signal phi1 can thus be derived from a next succeeding stage, such as an immediately succeeding stage. In this example embodiment, a PMOS transistor is used for phi1 and it is switched by the output of the next stage of amplification. Likewise, the timing for signal phi0, which actuates switch 110, can also be derived from a succeeding stage.

In this example embodiment, the size of capacitor 106 is sized large enough to provide the charge required to pull output 105 to a high state with a targeted slew rate. Current mirror 107 is strong enough to fully charge capacitor 106 during the period when switch 110 is open. In addition, it naturally will be recognized that switches 108 and 110 are often implemented as NMOS or PMOS transistors, and the on-resistance of these switches is generally low enough that when closed, the time constant with the capacitance of output 105 is negligibly small. As examples of suitable values, capacitor 106 is typically designed to be about 20× larger than the capacitance of output 105. The value of capacitor 106 may be about 30 femto-farads (30 fF), since there is often about 1.5 fF of capacitance between output 105 and ground. Switch 108 has between 1 kΩ and 8 kΩ of resistance giving a time constant for the pull-up of output 105 of between 1.5 psec and 12 psec (pico-seconds). In perhaps a helpful (but technologically inaccurate) analogy, capacitor 106 might be thought of as a bucket that pours water through a pipe (i.e., switch 108) into a smaller container (i.e., the capacitance of output 105). Barely any water is splashed out of capacitor 106 to completely fill output 105, and hence the time constant is essentially that of the pipe 108 and container 105. Strength of the current mirrors 103 and 107 are both equal at about 10 nA, but it is possible for the strength of the current minors to differ, in keeping with specific budgets for power and/or current, together with the target value for slew rate.

Although not shown, additional stages may follow the single stage of clock generation circuit 100 shown in FIG. 3. These additional stages are configured as largely identical to the configuration shown in FIG. 3. The additional stages permit slew rate to be increased gradually, in stages, to a degree that is deemed sufficient relative to the noise environment of the auxiliary circuitry, and the degree to which the clock generation circuitry is robust enough against the production of spurious clock signals. By increasing the slew rate gradually, it is possible to produce a clock signal with a high slew rate using a limited current/power budget.

For example, to provide more complete robustness to noise, two stages like the one shown in FIG. 3 can be put in series. This results in both the positive and negative edges of the V_in input signal 102 triggering a capacitor dump event.

SECOND EMBODIMENT

Figure 4:
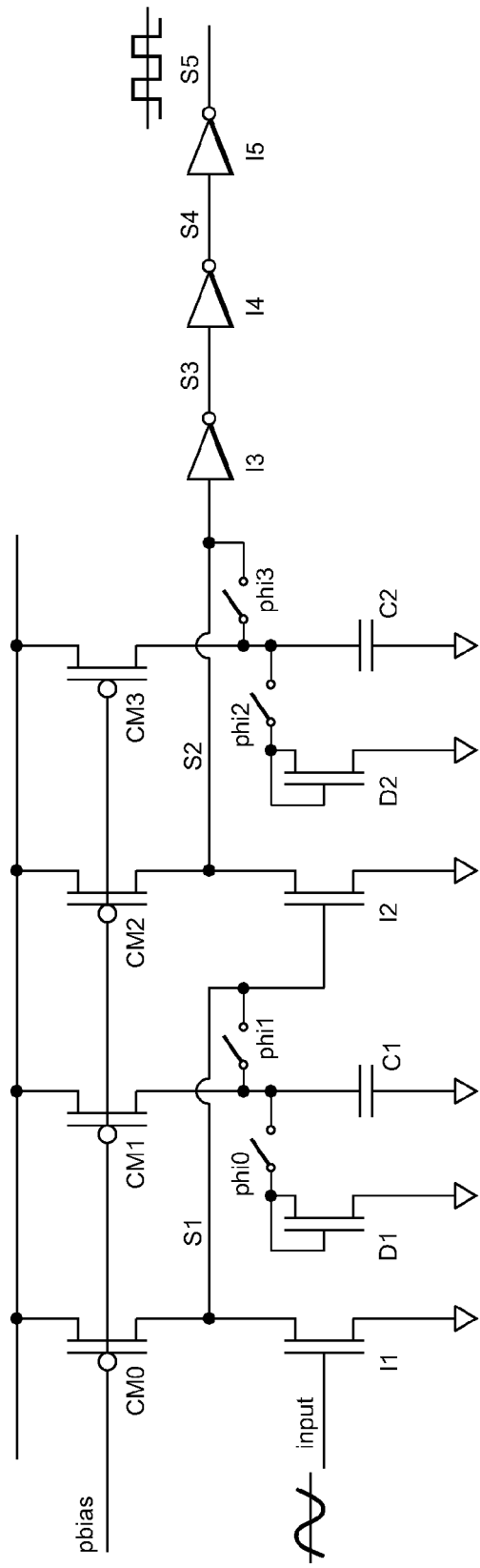
FIG. 4 is a schematic view of a clock generating circuit according to a second example embodiment of the invention.

FIG. 4 shows a simplified schematic of a second example embodiment of the invention Like the first embodiment, this second embodiment comprises clock generation circuitry packaged in an integrated circuit together with auxiliary circuitry (not shown). The auxiliary circuitry is clocked by a clock signal from the clock generation circuitry. The integrated circuit ordinarily includes terminals across which a crystal oscillator is connectable, for providing the input signal to the clock generation circuitry. Typically, the auxiliary circuitry is operable in at least a sleep mode and an operational mode, and the clock generation circuitry clocks the auxiliary circuitry during the sleep mode.

One difference between the first and second embodiments is that the second embodiment explicitly shows two stages of slew rate increase under a current budget imposed by current minors CM0 through CM3. In addition, these two stages are followed by three CMOS inverter stages 13 through 15, which are used to improve the shape of leading and trailing edges of the generated clock signal, as well as to generate timing signals used to drive switches in the first two stages.

Thus, as shown in FIG. 4, a clock generation circuitry according to the second embodiment includes two stages each comprised of an inverter fed by a first current mirror, and a capacitor charged through a second current mirror and coupled by a first switch across an output of the inverter. The first switch is actuated at a timing which substantially corresponds to a leading edge of the output of the inverter, so as to dump charge of the capacitor onto the output of the inverter, thereby to pull the output of the inverter at an increased slew rate, and is thereafter opened, so as to allow the second current mirror to charge the capacitor in preparation for a subsequent actuation of the first switch. In addition, each stage also includes a diode connected by a second switch across the capacitor. The second switch is actuated after actuation of the first switch so as to drain the capacitor through the diode, and is thereafter opened, so as to allow the second current mirror to charge the capacitor in preparation for a subsequent actuation of the first switch.

In more detail, the first stage of the clock generation circuitry of this second embodiment is comprised of first inverter I1 fed by first current mirror CM0, for inverting an input signal (designated as "input" in FIG. 4), which in this example embodiment is a slow slew rate signal such as the sinusoidal output of a crystal oscillator. A first capacitor C1 is charged through a second current mirror CM1. Capacitor C1 is coupled by a first switch across an output S1 of inverter I1. The first switch is actuated under control of timing signal phi1. A diode D1 is connected by a second switch across capacitor C1. The second switch is actuated under control of timing signal phi0.

Likewise, the second stage of the clock generation circuitry is comprised of second inverter 12 fed by third current mirror CM2, for inverting an input signal which for this second stage is the output of the first stage. A second capacitor C2 is charged through a fourth current mirror CM3. Second capacitor C2 is coupled by a third switch across an output S2 of second inverter 12. The third switch is actuated under control of timing signal phi3. A second diode D2 is connected by a fourth switch across second capacitor C2. The fourth switch is actuated under control of timing signal phi2.

These two stages are followed by three CMOS inverter stages, 13, 14 and 15, respectively, which are used to improve the shape of leading and trailing edges of the generated clock signal, as well as to generate timing signals used to drive switches in the first two stage. The output of each of these CMOS inverter stages is designated respectively as S3, S4 and S5.

Figure 5:
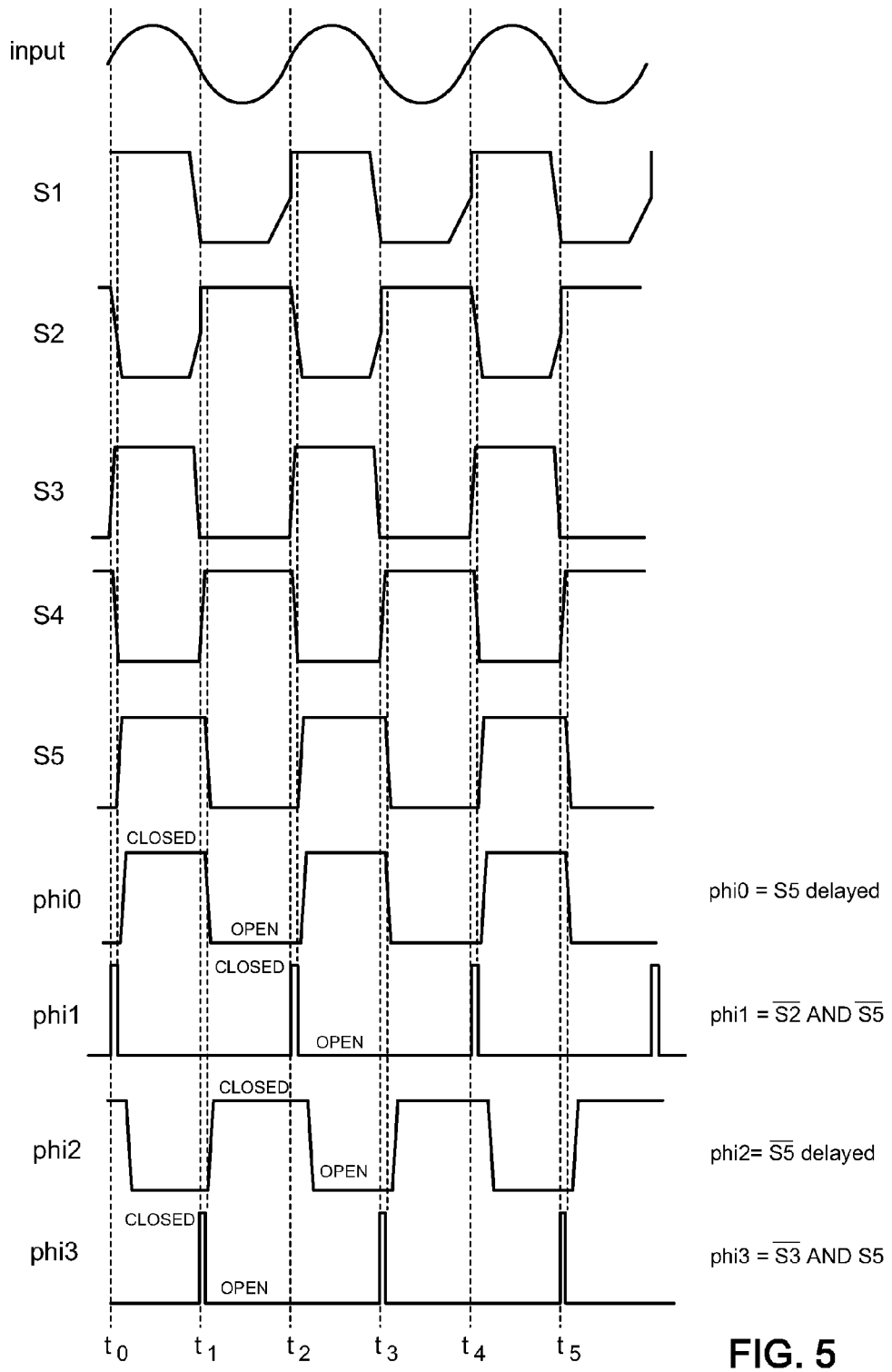
FIG. 5 is a timing diagram for the second example embodiment.

FIG. 5 shows a timing diagram for operation of the embodiment shown in FIG. 4. Specifically, FIG. 5 shows a representative slow slew rate input signal, such as the sinusoidal output of a crystal oscillator. In addition, FIG. 5 shows corresponding outputs of each of nodes S1, S2, S3, S4 and S5, in response to the representative input signal. Finally, FIG. 5 shows the derivation and generation of each of the switch actuation and timing signals phi0, phi1, phi2 and phi3.

As seen in FIG. 5, timing signal phi1 (for actuation of the first switch for capacitor C1 in the first stage) is generated by using the S2 output of the second stage as well as the S5 output of the final inverter IS, both inverted, i.e., phi1 closes when S2 and S5 are both zero. Vertical dotted lines are drawn in FIG. 5 to show this timing alignment. The capitalized word "AND" denotes a logical AND operation. Timing signal phi0 (for actuation of the second switch for diode D1 in the first stage) is generated by using the S5 output of the final inverter IS, delayed. Timing signal phi3 (for actuation of the third switch for capacitor C2 in the second stage) is generated by using the S3 output of the inverter 13, inverted, as well as the S5 output of inverter IS, i.e., phi3 closes when both S3 is low and S5 is high. Timing signal phi2 (for actuation of the fourth switch for diode D2 in the second stage) is generated by using the S5 output of the final inverter IS, delayed and inverted.

With these timings, the outputs of each of nodes S1, S2, S3, S4 and S5, in response to the representative input signal, are obtained as shown in FIG. 5. As seen in these output waveforms, particularly in the output waveforms for the S1 output from the first stage and the S2 output for the second stage, the slew rate for the leading edge of each stage's output is increased, due to the dumping of charge from a tricklecharged capacitor at the timings indicated therein.

THIRD EMBODIMENT

Figure 6A:
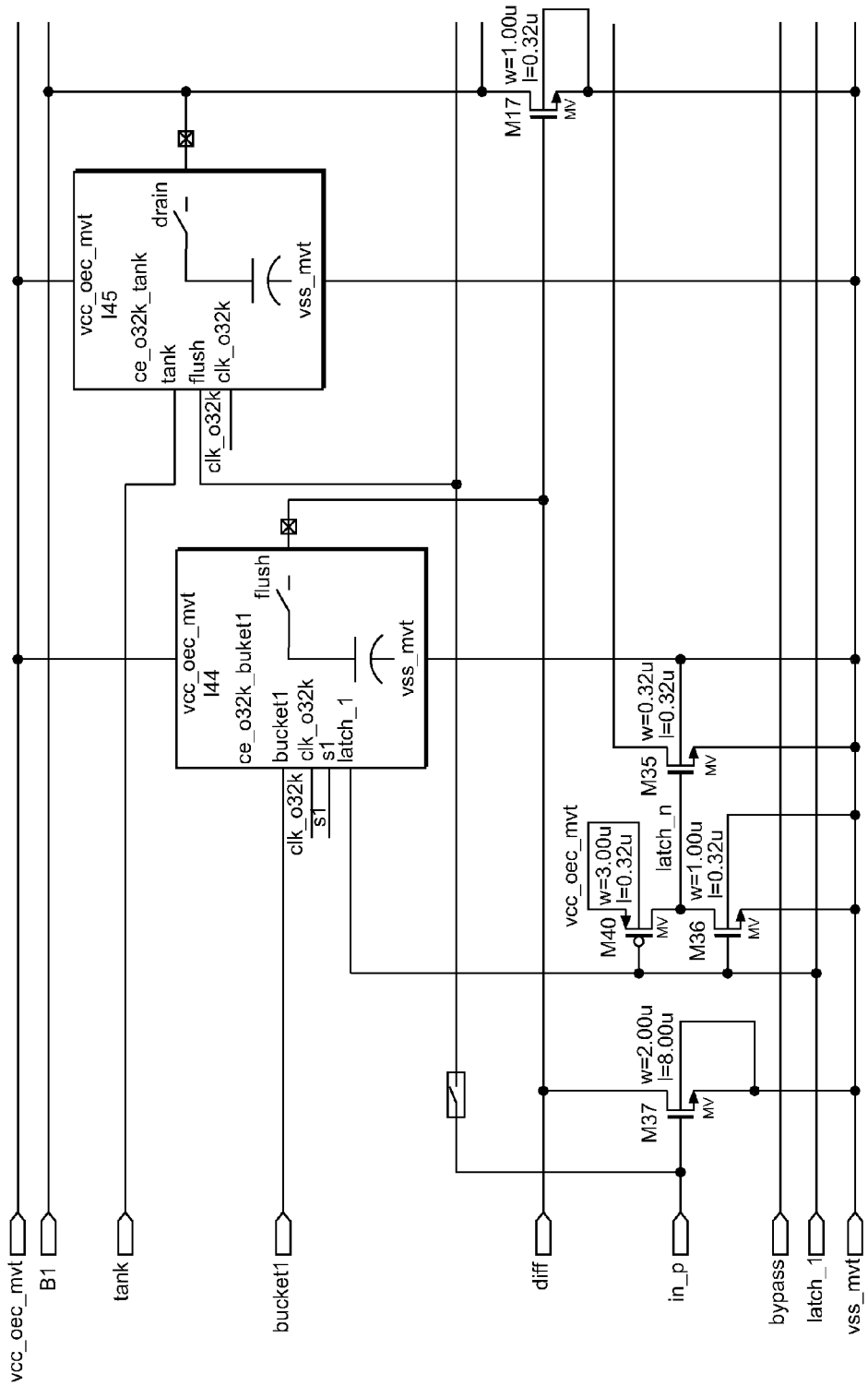
FIGS. 6A and 6B are detailed schematic views showing a clock generating circuit according to a third example embodiment of the invention.
Figure 6B:
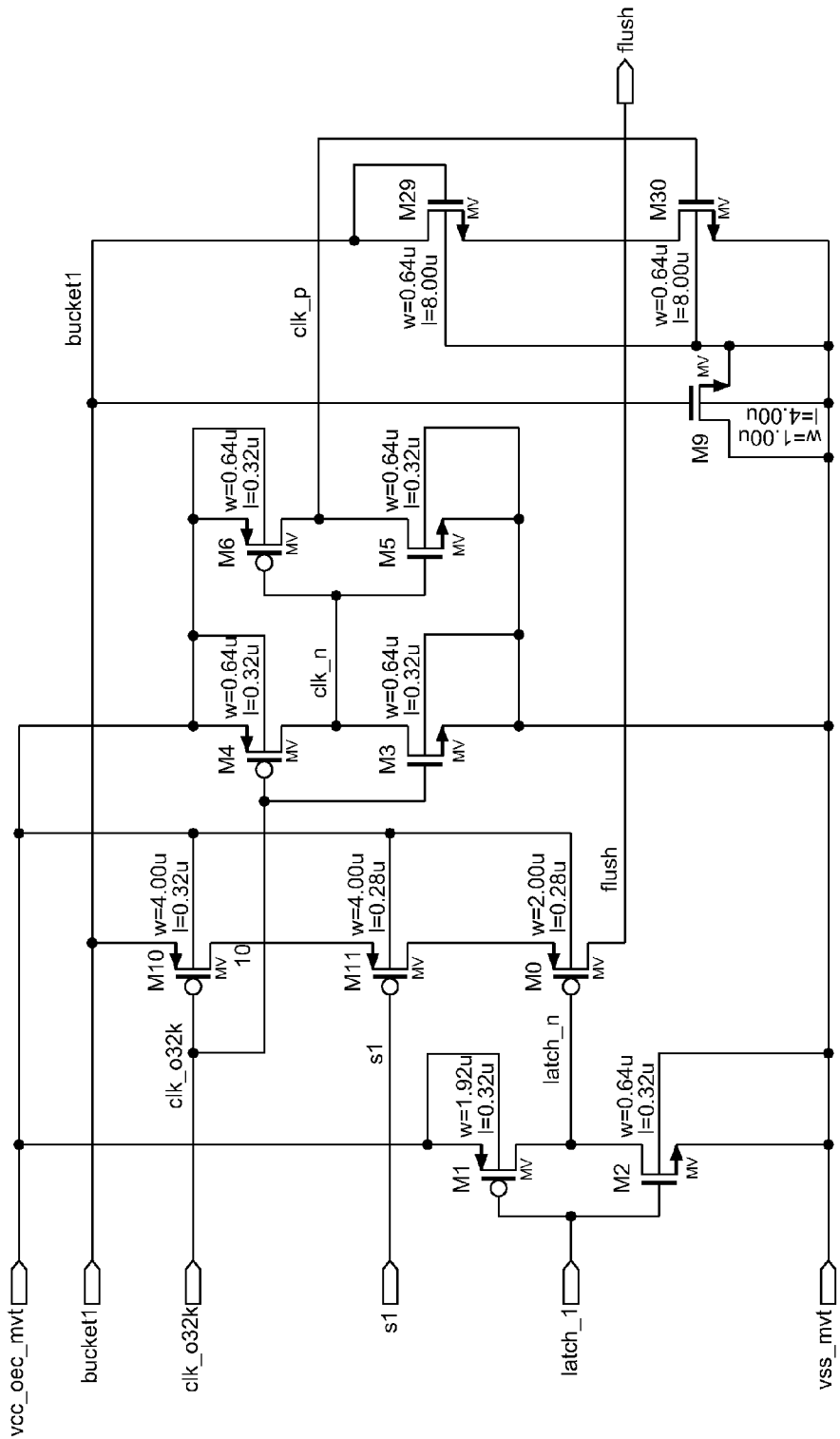

FIGS. 6A and 6B are detailed schematic views showing clock generating circuitry according to a third embodiment of the invention. In FIG. 6A, transistor M37 is the initial inverter.

The current mirror that supplies current to transistor M37 is inside a different block, however the current comes in through pin "diff." Cell block 144 is a first stage and contains the capacitor, diode, and switches. Again, the current mirror feeding current to the capacitor is inside a different block, and the current is fed in through node bucket1. Transistor M17 is the second stage of amplification and cell block 145 is attached to an output node of transistor M17. Cell block 145 is a second stage and contains a capacitor, diode and switches. The current mirror supplying transistor M17 is in another cell, as is the current mirror feeding the capacitor in cell block 145. Signals clk_o32k and s1 control the switches inside cell block 144. Signals flush and clk_o32k control the switches inside 145. Signal latch_1 is an enable for cell block 144, which prevents a feedback loop oscillation that may occur before the circuit is adequately warmed up.

FIG. 6B shows the interior of cell block 144 for the purpose of illustrating the operation of the circuit. The interior of cell block 145 is largely similar. In FIG. 6B, device M9 is the capacitor. Device M29 is the diode to discharge the capacitor when charge from the capacitor is not needed. Device M30 is the switch to connect the diode across the capacitor. Devices M10 and M11 are the switches to connect the capacitor across the output at the correct time. Device M0 is the enable and is controlled by signal latch_1 through the inverter formed by devices M1 and M2.

Signal clk_o32k turns device M10 off when it is desired to connect the diode across the capacitor and partially discharge the capacitor. It is desired to have device M10 off before device M30 turns on, and for this purpose a delay stage is created by devices M3-M6.

Figure 7:
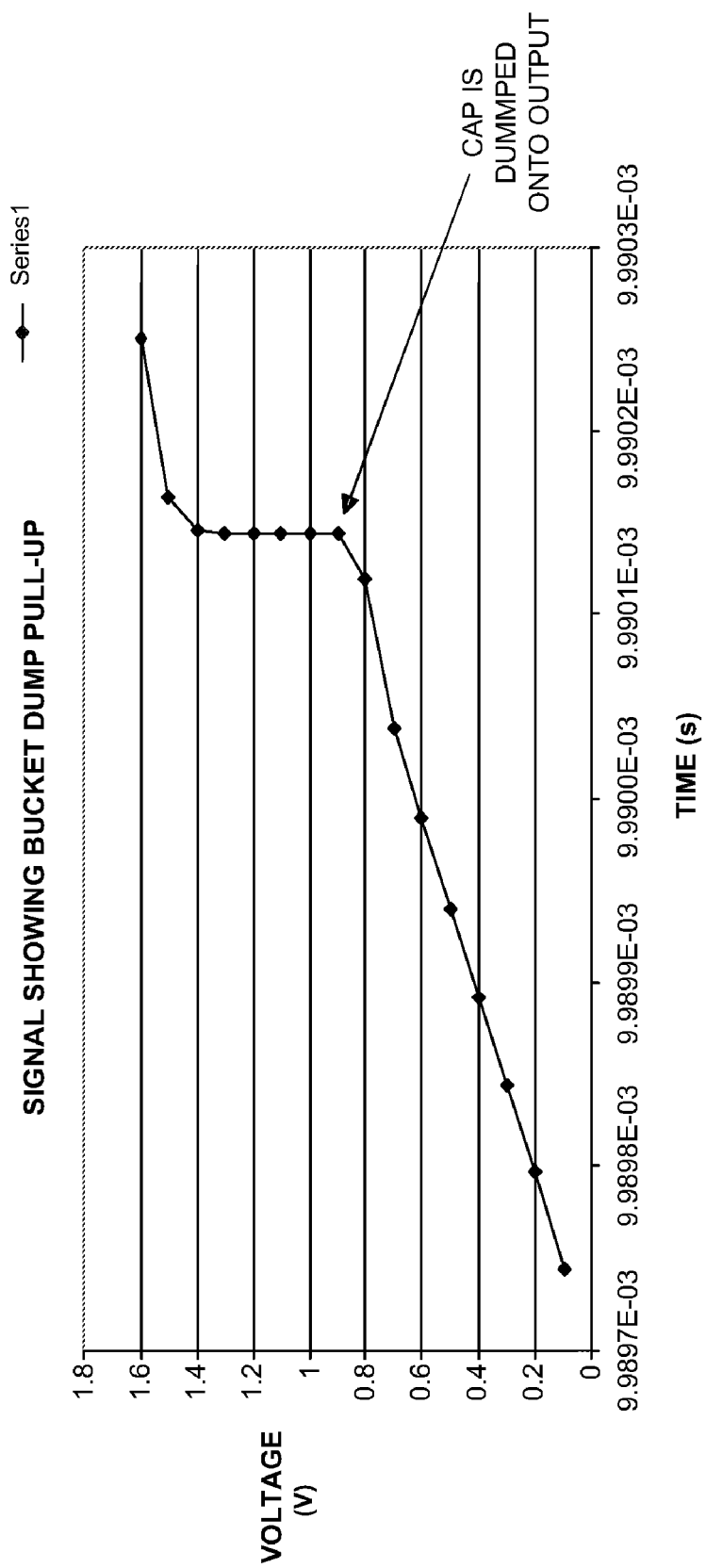
FIG. 7 is a waveform showing an output of the embodiment of FIGS. 6A and 6B.

FIG. 7 is simulation data showing the rapid pull-up of the switching signal when the capacitor is dumped onto the output node. The waveform shown is driving an inverter. The output of the inverter triggers the charge dump, so at the precise moment the circuit is sensitive to noise it is rapidly switched. The current minors supplying charge are sourcing about 10 nA continuous in this simulation. The fast slewing edge is transitioning in a few hundred picoseconds once the charge is dumped. Simulation and silicon results show this is fast enough to overcome noise on supply and ground.

Other Embodiments

Figure 8A:
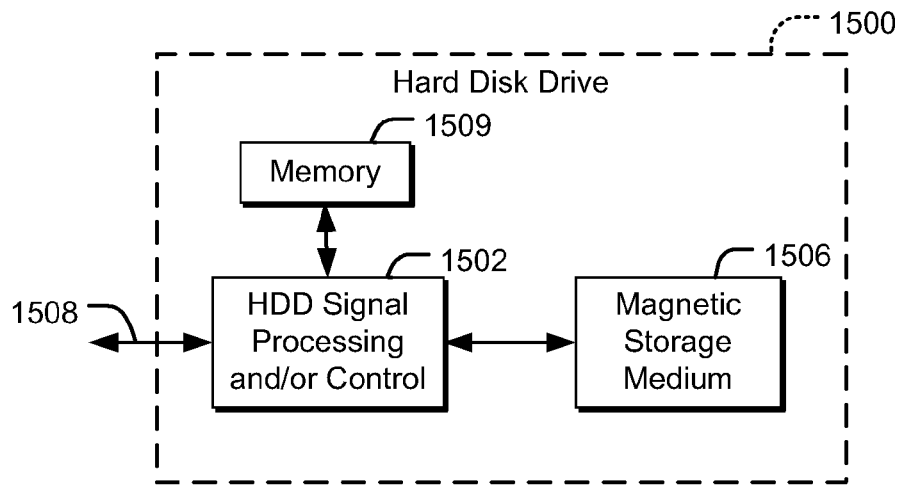
FIG. 8A is a block diagram showing an example embodiment in a hard disk drive (HDD).

Referring now to FIGS. 8A through 8H, various example embodiments of the present invention are shown. Referring to FIG. 8A, the present invention may be embodied as clock signal generation circuitry, particularly clock signal generation circuitry for a sleep mode as opposed to an operational mode, in a hard disk drive (HDD) 1500. The present invention may implement either or both signal processing and/or control circuits, which are generally identified in FIG. 8A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 8B:
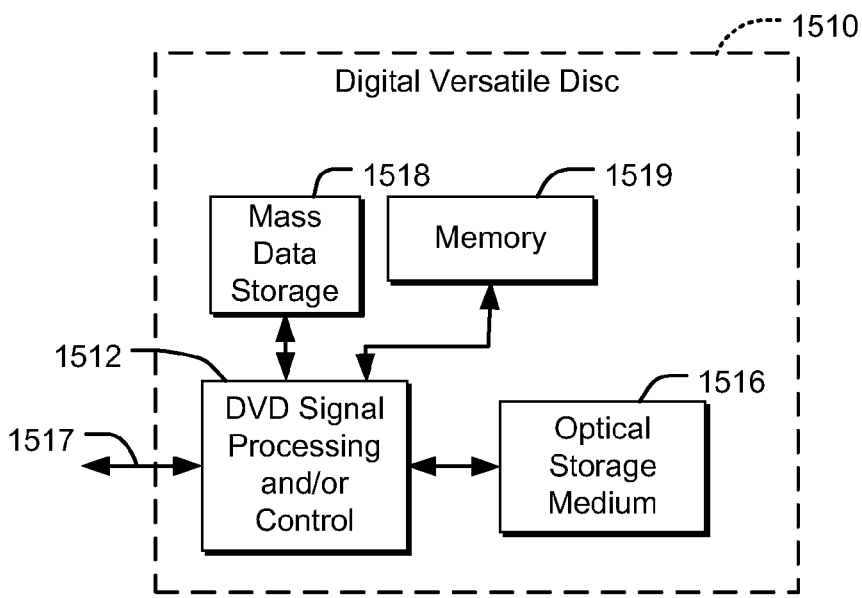
FIG. 8B is a block diagram of an example embodiment in a digital versatile disk (DVD) drive.

Referring now to FIG. 8B, the present invention may be embodied as clock signal generation circuitry, particularly clock signal generation circuitry for a sleep mode as opposed to an operational mode, in a digital versatile disc (DVD) drive 1510. The present invention may implement either or both signal processing and/or control circuits, which are generally identified in FIG. 8B at 1512, and/or mass data storage 1518 of DVD drive 1510. Signal processing and/or control circuit 1512 and/or other circuits (not shown) in DVD drive 1510 may process data, perform coding and/or encryption, perform calculations, and/or format data that is read from and/or data written to an optical storage medium 1516. In some implementations, signal processing and/or control circuit 1512 and/or other circuits (not shown) in DVD drive 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD drive 1510 may communicate with mass data storage 1518 that stores data in a nonvolatile manner. Mass data storage 1518 may include a hard disk drive (HDD) such as that shown in FIG. 8A. The HDD may be a mini HDD that includes one or more platters having a diameter that is smaller than approximately 1.8". DVD drive 1510 may be connected to memory 1519, such as RAM, ROM, low latency nonvolatile memory such as flash memory, and/or other suitable electronic data storage.

Figure 8C:
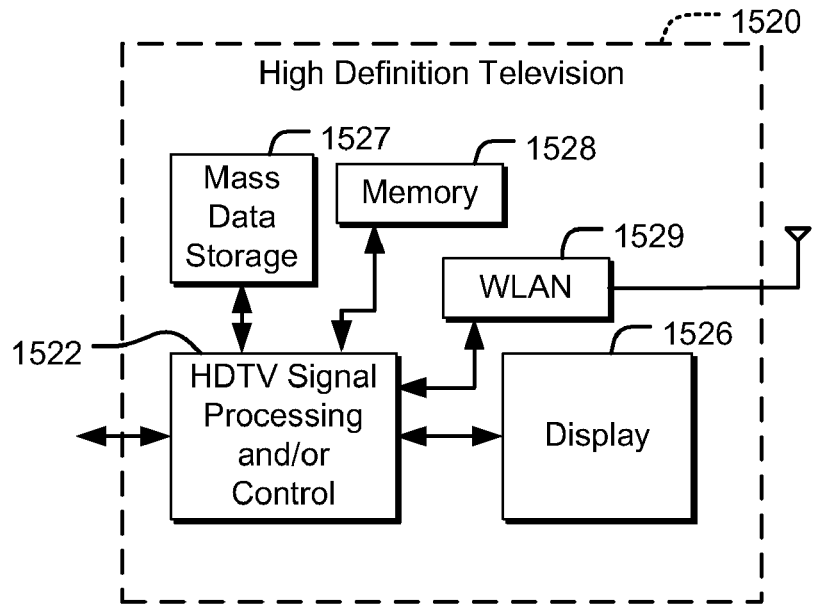
FIG. 8C is a block diagram of an example embodiment in a high definition television (HDTV).

Referring now to FIG. 8C, the present invention may be embodied as clock signal generation circuitry, particularly clock signal generation circuitry for a sleep mode as opposed to an operational mode, in a high definition television (HDTV) 1520. The present invention may implement either or both signal processing and/or control circuits, which are generally identified in FIG. 8C at 1522, a WLAN interface and/or mass data storage of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices, for example, hard disk drives or DVD drives. At least one HDD may have the configuration shown in FIG. 8A and/or at least one DVD drive may have the configuration shown in FIG. 8B. The HDD may be a mini HDD that includes one or more platters having a diameter that is smaller than approximately 1.8". HDTV 1520 may be connected to memory 1528 such as RAM, ROM, low latency nonvolatile memory such as flash memory and/or other suitable electronic data storage. HDTV 1520 also may support connections with a WLAN via a WLAN interface 1529.

Figure 8D:
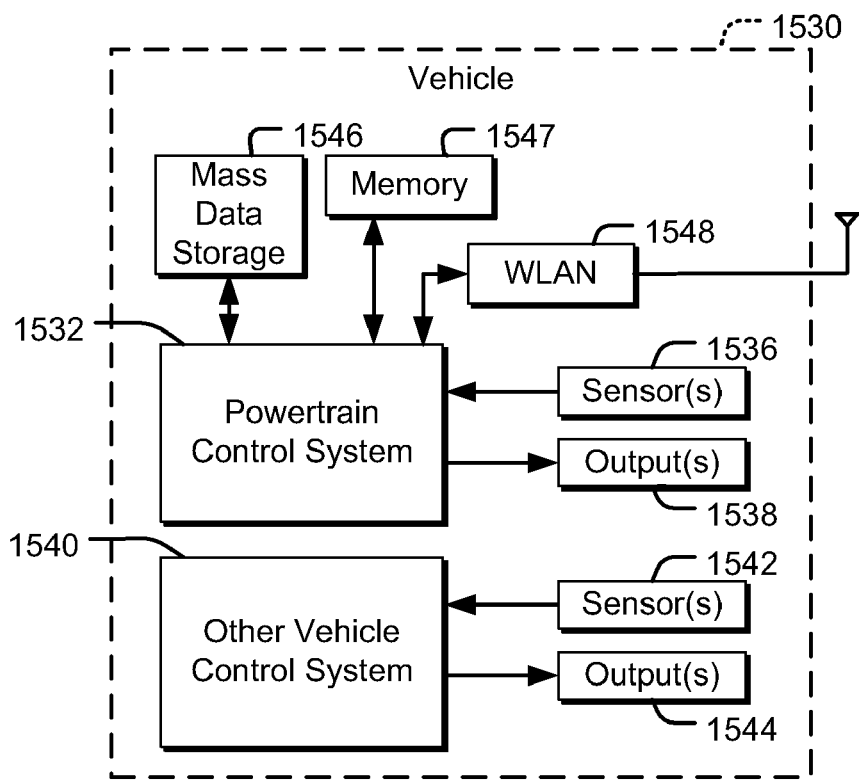
FIG. 8D is a block diagram of an example embodiment in a vehicle control system.

Referring now to FIG. 8D, the present invention may be embodied as clock signal generation circuitry, particularly clock signal generation circuitry for a sleep mode as opposed to an operational mode, in a control system of a vehicle 1530, WLAN interface and/or mass data storage of the vehicle 1530. In some implementations, the present invention implements a powertrain control system 1532 that receives inputs from one or more sensors 1536 such as temperature sensors, pressure sensors, rotational sensors, airflow sensors and/or any other suitable sensors and/or that generates one or more output control signals 1538 such as engine operating parameters, transmission operating parameters, braking parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices, for example, hard disk drives and/or DVD drives. At least one HDD may have the configuration shown in FIG. 8A and/or at least one DVD drive may have the configuration shown in FIG. 8B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via a WLAN interface 1548. The control system 1540 may also include mass data storage, memory and/or a WLAN interface (all not shown).

Figure 8E:
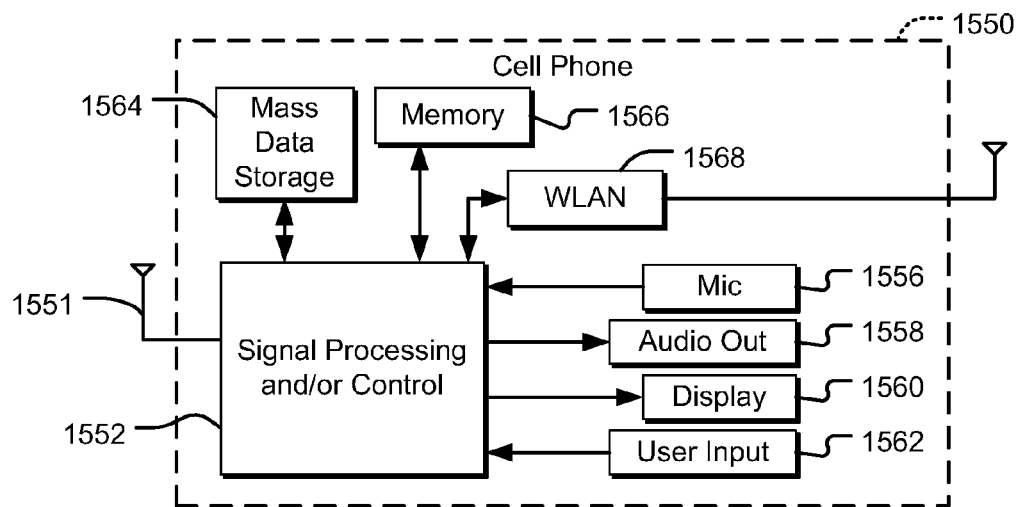
FIG. 8E is a block diagram of an example embodiment in a cellular or mobile phone.

Referring now to FIG. 8E, the present invention may be embodied as clock signal generation circuitry, particularly clock signal generation circuitry for a sleep mode as opposed to an operational mode, in a cellular phone 1550 that may include a cellular antenna 1551. The present invention may implement either or both signal processing and/or control circuits, which are generally identified in FIG. 8E at 1552, a WLAN interface and/or mass data storage of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices, for example, hard disk drives and/or DVD drives. At least one HDD may have the configuration shown in FIG. 8A and/or at least one DVD drive may have the configuration shown in FIG. 8B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via a WLAN interface 1568.

Figure 8F:
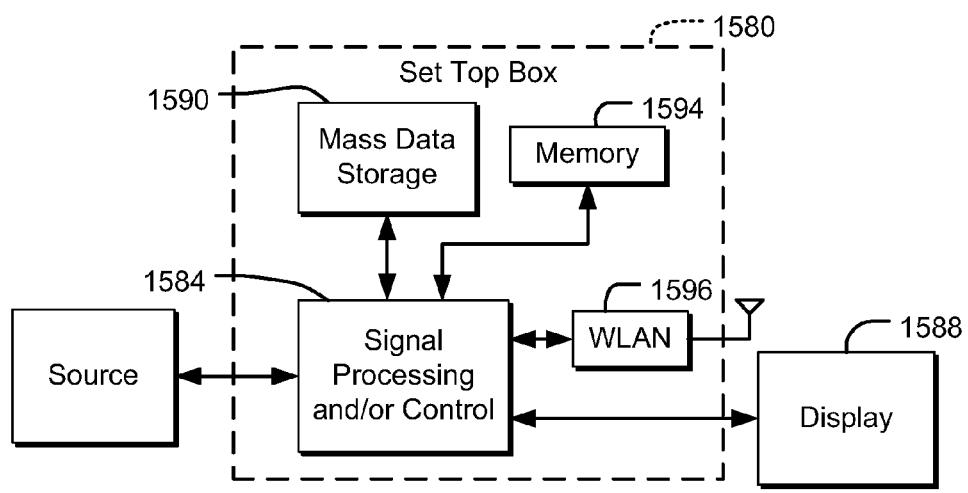
FIG. 8F is a block diagram of an example embodiment in a set-top box (STB).

Referring now to FIG. 8F, the present invention may be embodied as clock signal generation circuitry, particularly clock signal generation circuitry for a sleep mode as opposed to an operational mode, in a set top box 1580. The present invention may implement either or both signal processing and/or control circuits, which are generally identified in FIG. 8F at 1584, a WLAN interface and/or mass data storage of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices, for example, hard disk drives and/or DVD drives. At least one HDD may have the configuration shown in FIG. 8A and/or at least one DVD may have the configuration shown in FIG. 8B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via a WLAN network interface 1596.

Figure 8G:
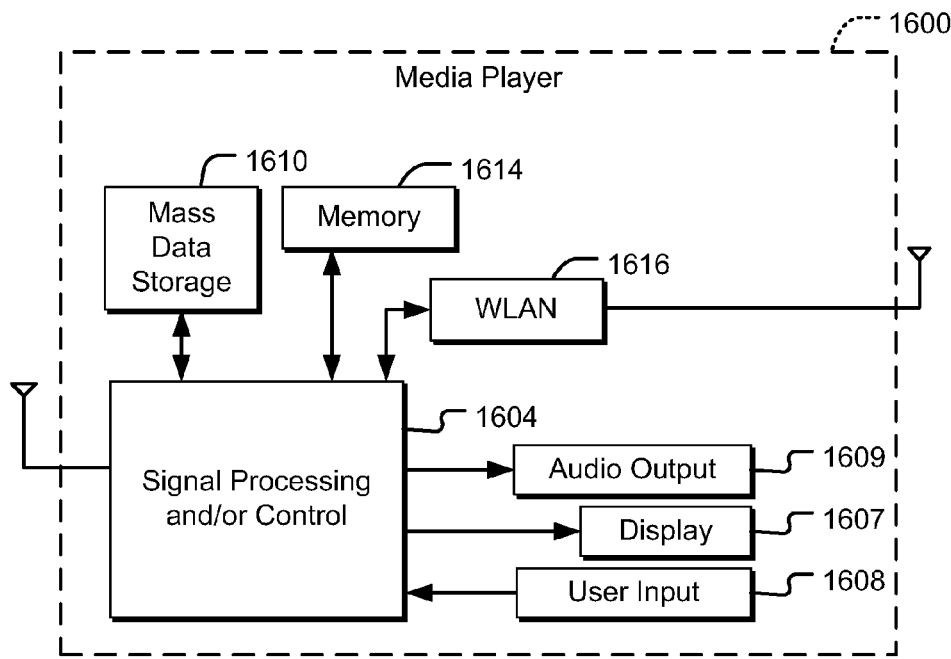
FIG. 8G is a block diagram of an example embodiment in a media player.

Referring now to FIG. 8G, the present invention may be embodied as clock signal generation circuitry, particularly clock signal generation circuitry for a sleep mode as opposed to an operational mode, in a media player 1600. The present invention may implement either or both signal processing and/or control circuits, which are generally identified in FIG. 8G at 1604, a WLAN interface and/or mass data storage of the media player 1600. In some implementations, media player 1600 includes a display 1607 and/or a user input 1608 such as a keypad, touchpad and the like. In some implementations, media player 1600 may employ a graphical user interface (GUI) that typically employs menus, drop down menus, icons and/or a point-and-click interface via display 1607 and/or user input 1608. Media player 1600 further includes an audio output 1609 such as a speaker and/or audio output jack. Signal processing and/or control circuits 1604 and/or other circuits (not shown) of media player 1600 may process data, perform coding and/or encryption, perform calculations, format data and/or perform any other media player function.

Media player 1600 may communicate with mass data storage 1610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example, hard disk drives and/or DVD drives. At least one HDD may have the configuration shown in FIG. 8A and/or at least one DVD drive may have the configuration shown in FIG. 8B. The HDD may be a mini HDD that includes one or more platters having a diameter that is smaller than approximately 1.8". Media player 1600 may be connected to memory 1614 such as RAM, ROM, low latency nonvolatile memory such as flash memory and/or other suitable electronic data storage. Media player 1600 also may support connections with a WLAN via a WLAN interface 1616. Still other implementations in addition to those described above are contemplated.

Figure 8H:
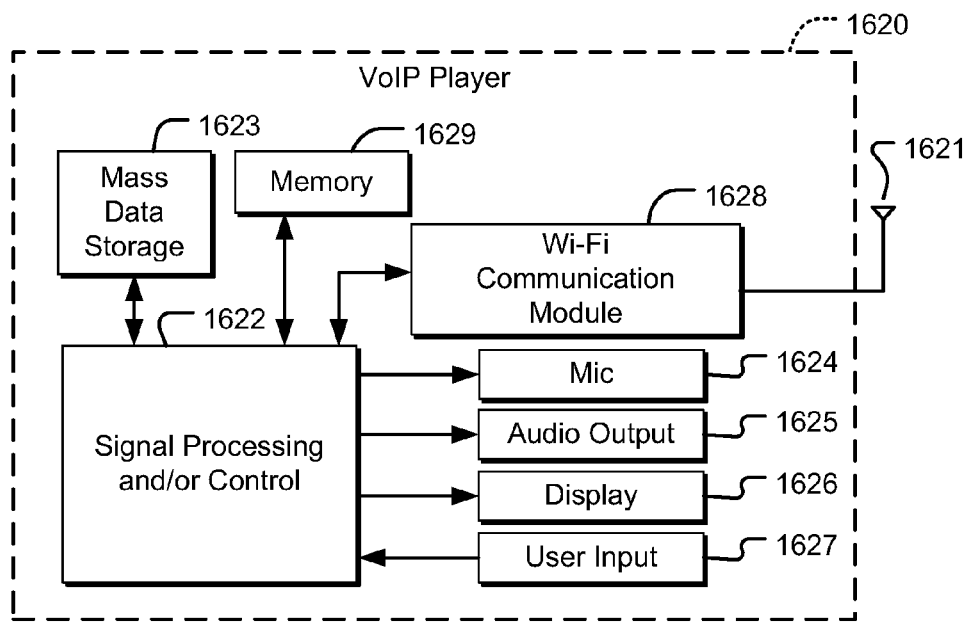
FIG. 8H is a block diagram of an example embodiment in a Voice-over Internet Protocol (VoIP) player.

Referring to FIG. 8H, the present invention may be embodied as clock signal generation circuitry, particularly clock signal generation circuitry for a sleep mode as opposed to an operational mode, in a Voice over Internet Protocol (VoIP) player 1620 that may include an antenna 1621. The present invention may implement either or both signal processing and/or control circuits, which are generally identified in FIG. 8H at 1622, a wireless interface and/or mass data storage of the VoIP player 1623. In some implementations, VoIP player 1620 includes, in part, a microphone 1624, an audio output 1625 such as a speaker and/or audio output jack, a display monitor 1626, an input device 1627 such as a keypad, pointing device, voice actuation and/or other input devices, and a Wireless Fidelity (Wi-Fi) communication module 1628. Signal processing and/or control circuits 1622 and/or other circuits (not shown) in VoIP player 1620 may process data, perform coding and/or encryption, perform calculations, format data and/or perform other VoIP player functions.

VoIP player 1620 may communicate with mass data storage 1623 that stores data in a nonvolatile manner such as optical and/or magnetic storage devices, for example, hard disk drives and/or DVD drives. At least one HDD may have the configuration shown in FIG. 8A and/or at least one DVD drive may have the configuration shown in FIG. 8B. The HDD may be a mini HDD that includes one or more platters having a diameter that is smaller than approximately 1.8". VoIP player 1620 may be connected to memory 1629, which may be a RAM, ROM, low latency nonvolatile memory such as flash memory and/or other suitable electronic data storage. VoIP player 1620 is configured to establish communications link with a VoIP network (not shown) via Wi-Fi communication module 1628.

The invention has been described above with respect to particular illustrative embodiments. It is understood that the invention is not limited to the above-described embodiments and that various changes and modifications may be made without departing from the scope of the invention.

What is claimed is:

1. A clock generation circuit operable to generate a high slew rate clock signal using an input signal, comprising:
    an inverter fed by a first current mirror, the inverter to invert the input signal;
    a capacitor charged through a second current mirror, wherein the capacitor is coupled by a first switch to an output of the inverter;
    wherein the first switch is actuated at a timing which substantially corresponds to a leading edge of the output of the inverter, the first switch to dump charge of the capacitor onto the output of the inverter, thereby to increase slew rate of the output of the inverter; and
    wherein the first switch is thereafter opened, so as to allow the second current mirror to charge the capacitor in preparation for a subsequent actuation of the first switch.

2. A clock generation circuit according to claim 1, further comprising a diode connected by a second switch across the capacitor, wherein the second switch is actuated after actuation of the first switch so as to drain the capacitor through the diode, and wherein the second switch is thereafter opened, so as to allow the second current mirror to charge the capacitor in preparation for a subsequent actuation of the first switch.

3. A clock generation circuit according to claim 1, comprised of first and second stages,
    wherein the first stage is comprised of the inverter, the capacitor, the first switch, and the first and second current mirrors;
    wherein the second stage comprises:
    a second inverter fed by a third current mirror, for inverting the output of the first inverter;
    a second capacitor charged through a fourth current mirror, wherein the second capacitor is coupled by a third switch to an output of the second inverter;
    wherein the third switch is actuated at a timing which substantially corresponds to a leading edge of the output of the second inverter, so as to dump charge of the second capacitor onto the output of the second inverter, thereby to increase slew rate of the output of the second inverter; and
    wherein the third switch is thereafter opened, so as to allow the third current mirror to charge the second capacitor in preparation for a subsequent actuation of the third switch.

4. A clock generation circuit according to claim 3, wherein the first switch is actuated by using the output of the second inverter.

5. A clock generation circuit according to claim 3, further comprising:
    a first diode connected by a second switch across the capacitor, wherein the second switch is actuated after actuation of the first switch so as to drain the capacitor through the first diode, and wherein the second switch is thereafter opened, so as to allow the second current mirror to charge the capacitor in preparation for a subsequent actuation of the first switch; and
    a second diode connected by a fourth switch across the second capacitor, wherein the fourth switch is actuated after actuation of the third switch so as to drain the second capacitor through the second diode, and wherein the fourth switch is thereafter opened, so as to allow the fourth current mirror to charge the second capacitor in preparation for a subsequent actuation of the third switch.

6. A clock generation circuit according to claim 1, packaged in an integrated circuit, wherein the integrated circuit includes terminals coupled to the inverter and across which a crystal oscillator is connectable, the crystal oscillator to provide the input signal to the inverter.

7. A clock generation circuit according to claim 6, wherein the integrated circuit includes auxiliary circuitry operable in at least a sleep mode and an operational mode, and wherein the high slew rate clock signal clocks the auxiliary circuitry during the sleep mode.

8. A method for generating a high slew rate clock signal using an input signal, wherein the method is performed in a clock generation circuit that comprises an inverter fed by a first current mirror, and a capacitor charged through a second current mirror, wherein the capacitor is coupled by a first switch to an output of the inverter, wherein the method comprises:
    inverting the input signal at a current limited rate determined by the first current mirror, so as to obtain an inverted signal at the output of the inverter;
    actuating the first switch at a timing which substantially corresponds to a leading edge of the output of the inverter, so as to dump charge of the capacitor onto the output of the inverter, thereby to increase slew rate of the output of the inverter; and
    thereafter opening the first switch, so as to allow the second current mirror to charge the capacitor in preparation for a subsequent actuation of the first switch.

9. A method for generating a high slew rate clock signal according to claim 8, wherein the clock generation circuit further comprises a diode connected by a second switch across the capacitor, wherein the method further comprises:
    actuating the second switch after actuation of the first switch so as to drain the capacitor through the diode; and
    thereafter opening the second switch, so as to allow the second current mirror to charge the capacitor in preparation for a subsequent actuation of the first switch.

10. A method for generating a high slew rate clock signal according to claim 8, wherein the clock generation circuit is further comprised of first and second stages, wherein the first stage is comprised of the inverter, the capacitor, the first switch, and the first and second current minors, and wherein the second stage comprises a second inverter fed by a third current mirror, and a second capacitor charged through a fourth current mirror, wherein the second capacitor is coupled by a third switch to an output of the second inverter, and wherein the method further comprises:

inverting the output of the first inverter at a current limited rate determined by the third current mirror, so as to obtain an inverted signal at the output of the second inverter;

actuating the third switch at a timing which substantially corresponds to a leading edge of the output of the second inverter, so as to dump charge of the second capacitor onto the output of the second inverter, thereby to increase slew rate of the output of the second inverter; and thereafter opening the third switch, so as to allow the third current mirror to charge the second capacitor in preparation for a subsequent actuation of the third switch.

11. A method for generating a high slew rate clock signal according to claim 10, wherein the first switch is actuated by using the output of the second inverter.

12. A method for generating a high slew rate clock signal according to claim 10, wherein the clock generation circuit is further comprised of a first diode connected by a second switch across the capacitor, and a second diode connected by a fourth switch across the second capacitor, wherein the method further comprises:

actuating the second switch after actuation of the first switch so as to drain the capacitor through the first diode;

thereafter opening the second switch, so as to allow the second current mirror to charge the capacitor in preparation for a subsequent actuation of the first switch;

actuating the fourth switch after actuation of the third switch so as to drain the second capacitor through the second diode; and thereafter opening the fourth switch, so as to allow the fourth current mirror to charge the second capacitor in preparation for a subsequent actuation of the third switch.

13. A method for generating a high slew rate clock signal according to claim 8, wherein the clock generation circuit is packaged in an integrated circuit, and further comprising coupling of a crystal oscillator to terminals of the integrated circuit, and coupling of the terminals to the inverter, the crystal oscillator to provide the input signal to the inverter.

14. A method for generating a high slew rate clock signal according to claim 13, wherein the integrated circuit includes auxiliary circuitry operable in at least a sleep mode and an operational mode, and further comprising clocking of the auxiliary circuitry during the sleep mode with the high slew rate clock signal.

* * * * *